US010091873B1

(12) United States Patent
Xiong

(10) Patent No.: US 10,091,873 B1
(45) Date of Patent: Oct. 2, 2018

(54) PRINTED CIRCUIT BOARD AND INTEGRATED CIRCUIT PACKAGE

(71) Applicant: Innovium, Inc., San Jose, CA (US)

(72) Inventor: Yongming Xiong, Fremont, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 15/630,636

(22) Filed: Jun. 22, 2017

(51) Int. Cl.
| | | |
|---|---|---|
| H05K 1/02 | (2006.01) | |
| H01L 23/528 | (2006.01) | |
| H05K 1/18 | (2006.01) | |
| H05K 1/11 | (2006.01) | |
| H05K 1/03 | (2006.01) | |

(52) U.S. Cl.
CPC ......... *H05K 1/0298* (2013.01); *H05K 1/0245* (2013.01); *H05K 1/0287* (2013.01); *H05K 1/03* (2013.01); *H05K 1/113* (2013.01); *H05K 1/185* (2013.01)

(58) Field of Classification Search
CPC ... H01L 2224/0912; H01L 2224/17104; H01L 2224/33104; H01L 23/481; H01L 23/4824; H01L 23/498; H01L 23/49822; H01L 23/49827; H01L 23/5226; H01L 23/528; H01L 23/5286; H01L 24/02; H01L 24/03; H01L 2924/00; H01L 2924/15311; H05K 1/0245; H05K 1/0287; H05K 1/0298; H05K 1/113
See application file for complete search history.

(56) References Cited

U.S. PATENT DOCUMENTS

| | | | |
|---|---|---|---|
| 5,420,758 A | 5/1995 | Liang | |
| 5,912,809 A | 6/1999 | Steigerwald et al. | |
| 6,198,635 B1 * | 3/2001 | Shenoy | H01L 23/49838 174/261 |
| 6,293,827 B1 * | 9/2001 | Stokoe | H01R 13/514 439/108 |
| 6,617,243 B1 * | 9/2003 | Weekly | H01L 23/49827 257/700 |
| 6,944,031 B2 | 9/2005 | Takami | |
| 6,977,348 B2 | 12/2005 | Ho et al. | |
| 6,994,569 B2 * | 2/2006 | Minich | H01R 29/00 439/79 |
| 7,078,812 B2 * | 7/2006 | Frank | H01L 23/49822 257/758 |
| 7,347,701 B2 * | 3/2008 | Daly | H01R 43/0249 439/68 |
| 7,405,477 B1 * | 7/2008 | Tao | H01L 23/49838 257/659 |

(Continued)

*Primary Examiner* — Earl Taylor
(74) *Attorney, Agent, or Firm* — Fish & Richardson P.C.

(57) ABSTRACT

An apparatus comprising a printed circuit board (PCB) that includes: a multilayer lamination of layers; vias on a surface of the PCB; and bonding pads that couple a ball grid array of an integrated circuit (IC) package to layers through the vias, wherein the bonding pads includes: first bonding pads in a first area of the PCB, each first bonding pad being coupled to a via of the vias in the first area, second bonding pads arranged in a second area of the PCB, each second bonding pad being coupled to a via of the vias in the second area, and third bonding pads arranged in a third area of the PCB, each third bonding pad being coupled to two or more vias of the vias in the third area, wherein the third area is located between the first area and the second area is disclosed.

34 Claims, 6 Drawing Sheets

(56) References Cited

U.S. PATENT DOCUMENTS

| | | | | |
|---|---|---|---|---|
| 7,709,747 B2* | 5/2010 | Morlion | ............. | H05K 1/114 |
| | | | | 174/262 |
| 7,935,896 B2* | 5/2011 | Morlion | ............. | H05K 1/114 |
| | | | | 174/262 |
| 8,149,219 B2 | 4/2012 | Lii et al. | | |
| 8,183,466 B2* | 5/2012 | Morlion | ............. | H05K 1/114 |
| | | | | 174/261 |
| 8,338,948 B2* | 12/2012 | Weekly | ............. | H01L 23/50 |
| | | | | 257/738 |
| 8,383,951 B2* | 2/2013 | Morlion | ............. | H05K 1/114 |
| | | | | 174/261 |
| 9,089,060 B1* | 7/2015 | Azeroual | ............. | H05K 1/114 |
| 9,355,951 B2* | 5/2016 | Kao | ............. | H01L 23/49838 |
| 9,425,149 B1* | 8/2016 | Jiang | ............. | H01L 24/14 |
| 9,647,762 B2* | 5/2017 | Arvelo | ............. | G02B 6/4295 |
| 9,666,544 B2* | 5/2017 | Zu | ............. | H01L 23/66 |
| 9,754,920 B2* | 9/2017 | Yamada | ............. | H01L 25/0657 |
| 2004/0216071 A1* | 10/2004 | Miller | ............. | G06F 17/5077 |
| | | | | 716/126 |
| 2006/0232301 A1* | 10/2006 | Morlion | ............. | H05K 1/114 |
| | | | | 326/126 |
| 2008/0030970 A1* | 2/2008 | Payne | ............. | H05K 1/0219 |
| | | | | 361/792 |
| 2013/0215588 A1* | 8/2013 | Kawai | ............. | H05K 1/0298 |
| | | | | 361/783 |
| 2014/0014404 A1* | 1/2014 | Hinton | ............. | H01L 23/50 |
| | | | | 174/261 |
| 2014/0104802 A1* | 4/2014 | Oikawa | ............. | H05K 1/18 |
| | | | | 361/783 |
| 2016/0205770 A1* | 7/2016 | Popovic | ............. | H01R 43/205 |
| | | | | 361/748 |
| 2017/0324208 A1* | 11/2017 | Popovic | ............. | H01L 23/50 |

* cited by examiner

PRINTED CIRCUIT BOARD AND INTEGRATED CIRCUIT PACKAGE

BACKGROUND

This specification relates to a printed circuit board (PCB) and an integrated circuit (IC) package.

An IC chip, such as an application-specific integrated circuit (ASIC) chip, can be attached to a substrate and coupled to a PCB, using solder balls to establish electrical connections with the PCB. Circuitry on the device formed by coupling the IC chip, the substrate and the PCB together can be used to transfer data in data networks, data centers, and many other suitable applications. For high-speed applications, such as serializer/deserializer (SerDes) input/output (I/O) in networking switch ASIC chips, electrical connections with the PCB may be established using flip chip ball grid array (FCBGA), in which the chip die is flip chip bonded to one side of the substrate while solder balls are attached to the other side of the substrate in a particular arrangement, where the solder balls are periodically placed in multiple rows and columns at a certain pitch. The solder balls attached on the substrate are flipped over to be coupled with bonding pads of a PCB.

There is a continuing need to increase the ASIC SerDes I/O connections to meet increasing networking data demand and data bandwidth demand. This has led to a need to increase the number of ball grid array (BGA) solder balls in an IC package to accommodate the increased I/O demand. With the I/O bandwidth becoming higher, the corresponding core logic is increased accordingly to process the increase in data bandwidth. This leads to a larger core logic power requirement, and BGA solder balls with greater power carry capacity are required to prevent electro-migration and to lower voltage drop. However, the BGA solder ball counts are limited by the package size and BGA pitch. The package size is limited by manufacturing issues such as substrate warpage, solder ball co-planarity, and the yield of the apparatus process. Lowering the BGA pitch is one way to get more BGA solder balls in a limited size package. However, smaller BGA pitch requires smaller BGA ball size because of manufacturing and assembling process limitation. Smaller solder ball means lower current capacity. Furthermore, small pitch BGA signal escape becomes difficult inside BGA field on PCB.

SUMMARY

The present disclosure describes an IC package. An IC package is any suitable packaged device or a part of a device, or a part of a system, including but not limited to: network switches, routers, servers, storage equipment, televisions, displays, super computers, desktop computers, laptop computers, tablets, and mobile devices such as smartphones, wearable devices, and media devices. The IC package transmits and receives signals to or from one or more external devices or systems through a PCB that is coupled to the IC package. In some implementations, the IC package receives and transmits signals without specifying particular external devices.

The PCB acts as a conduit to transfer I/O signals including transmit signals, e.g., electric signals sent from the IC package to the external devices or systems, and receive signals, e.g., electric signals sent from the external devices or systems to the IC package. For example, the PCB acts as a host for the IC chip of the IC package and connects the IC chip to one or more other IC chips of IC packages hosted by other PCBs.

The IC package described in this specification includes BGA solder balls that are arranged in three different sections of a BGA. The BGA solder balls arranged in a first section and a second section are used to transfer I/O signals and power signals or provide a grounding path to ground. The BGA solder balls arranged in a third section are used to provide a grounding path to ground or to provide a power signal, e.g., analog power. The BGA solder balls arranged in the third section provide separation between transmit signal BGA balls and receive signal BGA balls in the first and second sections. The third section is located between the first section and the second section to separate the transmit signals transferred through the BGA solder balls in the first section from the receive signals transferred through the BGA solder balls in the second section. In particular, each of the BGA solder balls arranged in the third section is coupled to two or more vias of a PCB. This coupling increases the distance, e.g., a via distance, between the BGA solder balls in the first section and the BGA solder balls in the second section. As the distance is increased, the electrical separation between the I/O signals is increased. In addition, one of the two or more vias is a grounding path for a signal, e.g., transmit signal, transferred through the BGA solder balls in the first section and another of the two or more vias is a grounding path for a signal, e.g., receive signal, transferred through the BGA solder balls in the second section. By separating a grounding path for the transmit signal from a grounding path for the receive signal, the two or more vias increases the separation between the transmit signal and the receive signal. As a result, the crosstalk between I/O signals can be reduced or eliminated even when the BGA pitch is lowered. In some implementations, the BGA solder balls are coupled to dog bone patterns of the PCB. Each dog bone pattern of the PCB includes a bonding pad, one or more vias, and one or more coupling portions that couple the bonding pad to the one or more vias. A BGA solder ball is coupled to a bonding pad of a dog bone pattern.

Using the arrangement of BGA solder balls as described above, the apparatus can transfer I/O signals at a higher sampling rate without altering Nyquist frequency, thereby enabling high speed signal processing. For example, in some implementations where the IC package includes an IC chip in a network switch, the IC package transmits and/or receives signals having an amplitude between 50 millivolts (mV) and 5 volts (V) at a sampling rate between 1 gigabits per second (Gb/s) and 100 Gb/s. As another example, in some implementations the IC package transmits and receives signals having an amplitude between 50 mV and 5 V at a sampling rate between 100 Gb/s and 500 Gb/s. In some implementations, an amplitude of a receive signal is different from an amplitude of a transmit signal. In some implementations, a sampling rate of a receive signal is different from a sampling rate of a transmit signal. The amplitudes and the sampling rates of the IC package as noted above are provided as illustrative examples and are not intended to limit different implementations to a particular range. Any suitable range of an amplitude and a sampling rate can be used for different implementations.

The present disclosure also describes a PCB that includes bonding pads and vias that are arranged in three different areas of the PCB. Each of the bonding pads is coupled to one or more of the vias. The bonding pads and the vias arranged in a first area and a second area are used to transfer I/O signals or power signals and the bonding pads and the vias in a third area are coupled to ground to provide a grounding path. The third area is located between the first area and the second area to separate signals, e.g., input signals, transferred through the bonding pads and the vias in the first area from signals, e.g., output signals, transferred through the bonding pads and the vias in the second area. In particular, each of the bonding pads arranged in the third area is coupled to two or more vias of the PCB. This increases the distance between the vias in the first area and the vias in the second area. As the distance is increased, the electrical separation between the I/O signals is increased. In addition, one of the two or more vias is a grounding path for a signal, e.g., transmit signal, transferred through the bonding pads in the first area and another of the two or more vias is a grounding path for a signal, e.g., receive signal, transferred through the bonding pads in the second area. By separating a grounding path for the transmit signal from a grounding path for the receive signal, the two or more vias increase the separation between the transmit signal and the receive signal. As a result, the crosstalk between I/O signals can be reduced or eliminated even when the BGA pitch is lowered. Moreover, the PCB of the apparatus can include a multilayer lamination of signal layers. The PCB transfers the receive signals and the transmit signals through different layers so that the apparatus can reduce or eliminate crosstalk occurring between the receive signals and the transmit signals, thereby enabling high speed signal processing.

In general, one innovative aspect of the subject matter described in this specification can be implemented in an apparatus comprising: a PCB that includes: a multilayer lamination of one or more ground layers, one or more power layers, and a plurality of signal layers; a plurality of vias that are located on a first surface of the PCB; and a plurality of bonding pads that couple a ball grid array of an IC package to the one or more ground layers, the one or more power layers, and the plurality of signal layers through the plurality of vias, wherein the plurality of bonding pads includes: first bonding pads that are arranged in a first area of the PCB and that are configured to transfer multiple pairs of first differential signals between the PCB and the IC package, each of the first bonding pads being coupled to a via of the plurality of vias in the first area, second bonding pads that are arranged in a second area of the PCB and that are configured to transfer multiple pairs of second differential signals between the PCB and the IC package, each of the second bonding pads being coupled to a via of the plurality of vias in the second area, and third bonding pads that are arranged in a third area of the PCB and that couple the IC package to ground of the PCB, each of the third bonding pads being coupled to two or more vias of the plurality of vias in the third area, wherein the third area is located between the first area and the second area.

The foregoing and other implementations can each optionally include one or more of the following features, alone or in combination. In particular, one implementation includes all the following features in combination. the signal layers include: a first group of signal layers corresponding to the first area; and a second group of signal layers that correspond to the second area and that are different from the first group of signal layers, wherein the multiple pairs of first differential signals are transferred through the first group of signal layers, and wherein the multiple pairs of second differential signals are transferred through the second group of signal layers. The second area is closer to the IC package compared to the first area, and wherein the second group of signal layers are at a different height of the multilayer lamination compared to the first group of signal layers. The multiple pairs of first differential signals are signals transferred from the PCB to the IC package, and wherein the multiple pairs of second differential signals are signals transferred from the IC package to the PCB. Strengths of the multiple pairs of first differential signals are weaker than strengths of the multiple pairs of second differential signals. The plurality of vias include: first vias that are coupled to the first bonding pads or the second bonding pads and that are back-drilled vias. The plurality of vias include: second vias that are coupled to the third bonding pads and that are conductive vias. The apparatus further includes: a substrate; an IC chip arranged on the substrate; and a ball grid array configured to electrically and mechanically couple the substrate to the PCB, the ball grid array including: first solder balls that are arranged in a first section of the ball grid array and that are configured to transfer the multiple pairs of first differential signals between the substrate and the PCB, each of the first solder balls being coupled to a via of the plurality of vias, second solder balls that are arranged in a second section of the ball grid array and that are configured to transfer the multiple pairs of second differential signals between the substrate and the PCB, each of the second solder balls being coupled to a via of the plurality of vias, and third solder balls that are arranged in a third section of the ball grid array and that couples the substrate to ground of the PCB, each of the third solder balls being coupled to two or more vias of the plurality of vias. The first section, the second section, and the third section are outside a perimeter of the IC chip. The first section corresponds to the first area of the PCB, the second section corresponds to the second area of the PCB, and the third section corresponds to the third area of the PCB. The multiple pairs of first differential signals have an amplitude between 50 mV and 5 V. The multiple pairs of second differential signals have an amplitude between 50 mV and 5 V. The multiple pairs of first differential signals are transferred at a sampling rate between 1 Gb/s and 500 Gb/s. The multiple pairs of second differential signals are transferred at a sampling rate between 1 Gb/s and 500 Gb/s. A first amplitude for the multiple pairs of first differential signals are different from a second amplitude for the multiple pairs of second differential signals. A first sampling rate for the multiple pairs of first differential signals are different from a second sampling rate for the multiple pairs of second differential signals. The apparatus further includes a first dog bone pattern that includes a third bonding pad of the third bonding pads and a via of the two or more vias of the plurality of vias in the third area, and a second dog bone pattern that includes a first bonding pad of the first bonding pads and a via of the plurality of vias in the first area, wherein the first dog bone pattern is oriented 180 degrees relative to the second dog bone pattern. The apparatus further includes: a first dog bone pattern that includes a third bonding pad of the third bonding pads and a via of the two or more vias of the plurality of vias in the third area, and a second dog bone pattern that includes a second bonding pad of the second bonding pads and a via of the plurality of vias in the second area, wherein the first dog bone pattern is oriented 270 degrees relative to the second dog bone pattern.

In general, another innovative aspect of the subject matter described in this specification can be implemented in an IC package comprising: a substrate; an IC chip arranged on the substrate; and a ball grid array configured to electrically and mechanically couple the substrate to a PCB, the ball grid array including: first solder balls that are arranged in a first section of the ball grid array and that are configured to transfer multiple pairs of first differential signals between the substrate and the PCB, each of the first solder balls configured to be coupled to a first via of the PCB through a first bonding pad of the PCB, second solder balls that are arranged in a second section of the ball grid array and that are configured to transfer multiple pairs of second differential signals between the substrate and the PCB, each of the second solder balls configured to be coupled to a second via of the PCB through a second bonding pad of the PCB, and third solder balls that are arranged in a third section of the ball grid array and that couples the substrate to ground of the PCB, each of the third solder balls configured to be coupled to two or more third vias of the PCB through a third bonding pad of the PCB, wherein the third section is located between the first section and the second section.

The foregoing and other implementations can each optionally include one or more of the following features, alone or in combination. In particular, one implementation includes all the following features in combination. the multiple pairs of first differential signals are signals transferred from the PCB to the IC package, and wherein the multiple pairs of second differential signals are signals transferred from the IC package to the PCB. Strengths of the multiple pairs of first differential signals are weaker than strengths of the multiple pairs of second differential signals. The first section, the second section, and the third section are outside a perimeter of the IC chip. The second section is closer to the IC chip compared to the first section. The multiple pairs of first differential signals have an amplitude between 50 mV and 5 V. The multiple pairs of second differential signals have an amplitude between 50 mV and 5 V. The multiple pairs of first differential signals are transferred at a sampling rate between 1 Gb/s and 500 Gb/s. The multiple pairs of second differential signals are transferred at a sampling rate between 1 Gb/s and 500 Gb/s. A first amplitude for the multiple pairs of first differential signals are different from a second amplitude for the multiple pairs of second differential signals. A first sampling rate for the multiple pairs of first differential signals are different from a second sampling rate for the multiple pairs of second differential signals. Each of the first solder balls is coupled to a first dog bone pattern that includes a first bonding pad of the first bonding pads and a first via of the first vias, wherein each of the third solder balls is coupled to a second dog bone pattern that includes a third bonding pad of the third bonding pads and a third via of the two or more third vias of the third vias, and wherein the first dog bone pattern is oriented 180 degrees relative to the second dog bone pattern. Each of the second solder balls is coupled to a first dog bone pattern that includes a second bonding pad of the second bonding pads and a second via of the second vias, wherein each of the third solder balls is coupled to a second dog bone pattern that includes a third bonding pad of the third bonding pads and a third via of the two or more third vias of the third vias, and wherein the first dog bone pattern is oriented 270 degrees relative to the second dog bone pattern.

In general, another innovative aspect of the subject matter described in this specification can be implemented in a network device including: a PCB that includes: a multilayer lamination of one or more ground layers, one or more power layers, and a plurality of signal layers, a plurality of vias that are located on a first surface of the PCB, and a plurality of bonding pads that couple a ball grid array of an IC package to the one or more ground layers, the one or more power layers, and the plurality of signal layers through the plurality of vias, wherein the plurality of bonding pads includes: first bonding pads that are arranged in a first area of the PCB and that are configured to transfer multiple pairs of first differential signals between the PCB and the IC package, each of the first bonding pads being coupled to a via of the plurality of vias in the first area, second bonding pads that are arranged in a second area of the PCB and that are configured to transfer multiple pairs of second differential signals between the PCB and the IC package, each of the second bonding pads being coupled to a via of the plurality of vias in the second area, and third bonding pads that are arranged in a third area of the PCB and that couple the IC package to ground of the PCB, each of the third bonding pads being coupled to two or more vias of the plurality of vias in the third area, wherein the third area is located between the first area and the second area; a substrate; an IC chip arranged on the substrate and that is configured to transmit or receive the multiple pairs of first differential signals and the multiple pairs of second differential signals; and a ball grid array configured to electrically and mechanically couple the substrate to the PCB, the ball grid array including: first solder balls that are arranged in a first section of the ball grid array and that are configured to transfer the multiple pairs of first differential signals between the substrate and the PCB, each of the first solder balls being coupled to a via of the plurality of vias, second solder balls that are arranged in a second section of the ball grid array and that are configured to transfer the multiple pairs of second differential signals between the substrate and the PCB, each of the second solder balls being coupled to a via of the plurality of vias, and third solder balls that are arranged in a third section of the ball grid array and that couples the substrate to ground of the PCB, each of the third solder balls being coupled to two or more vias of the plurality of vias.

The foregoing and other implementations can each optionally include one or more of the following features, alone or in combination. In particular, one implementation includes all the following features in combination. The network device is a router. The network device is a network switch.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
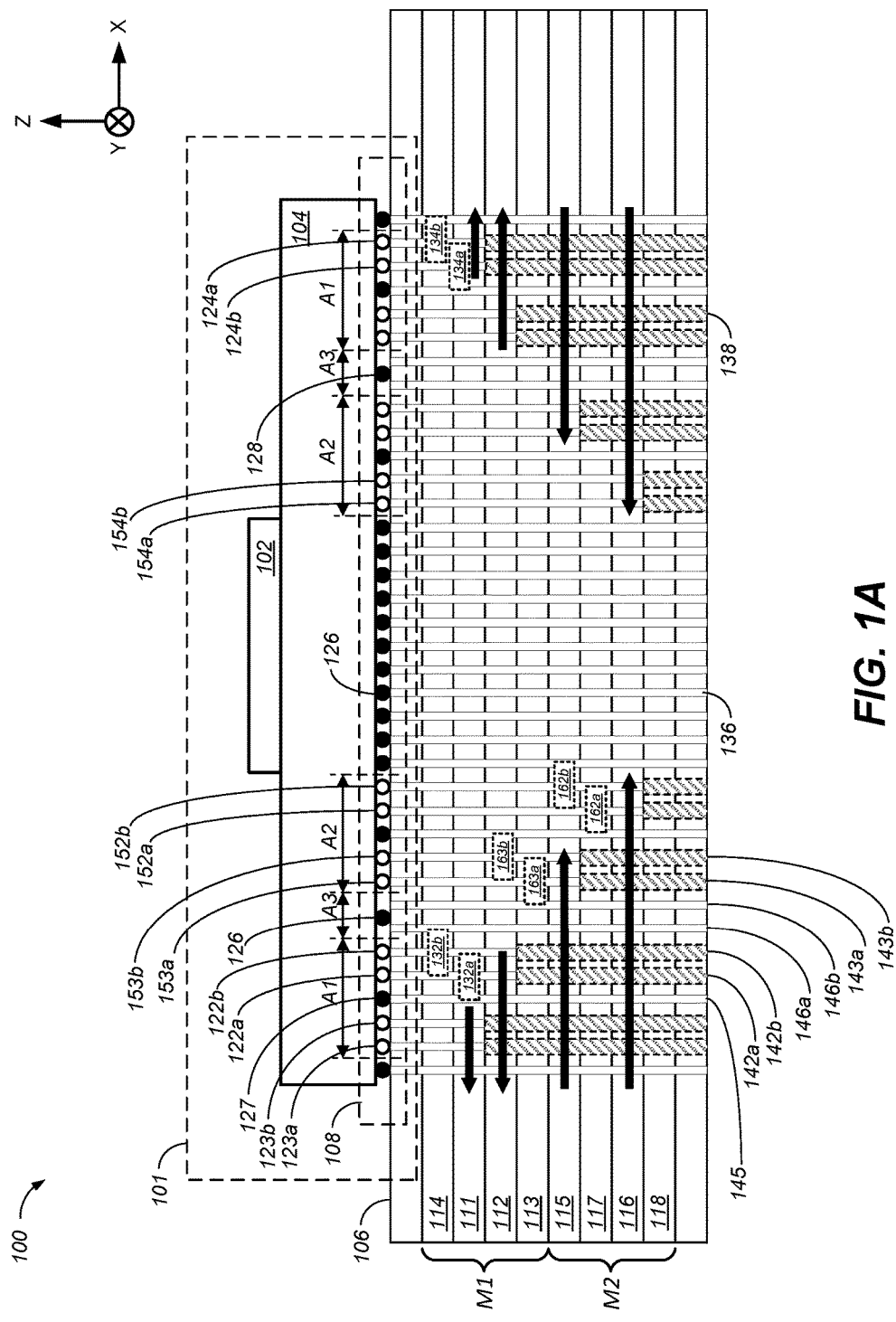
FIG. 1A is a diagram illustrating an example apparatus that includes an IC package and a PCB.
Figure 1B:
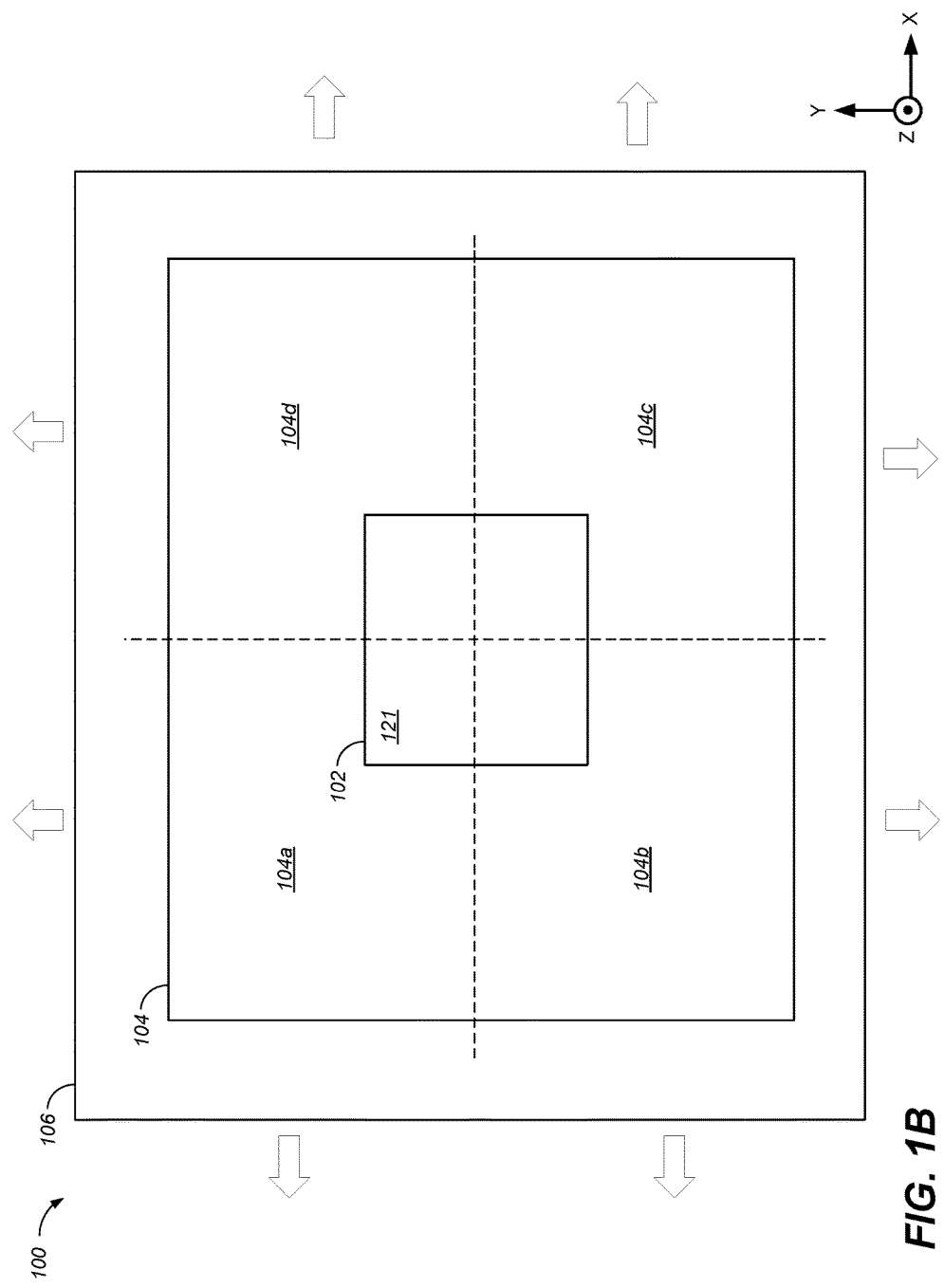
FIGS. 1B and 1C are diagrams illustrating a top view of the example apparatus shown in FIG. 1A.
Figure 1C:
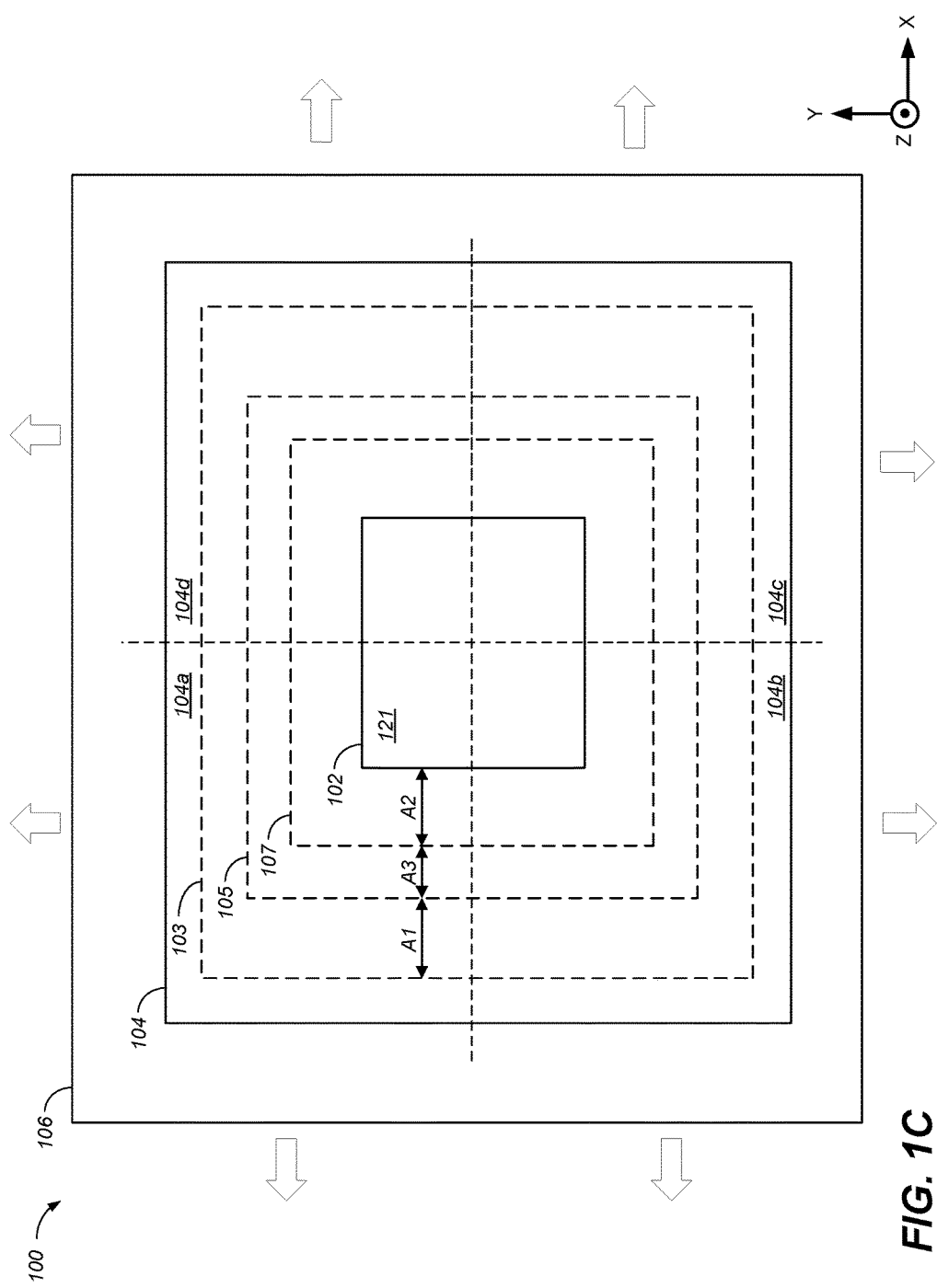

FIG. 1A illustrates an example apparatus 100 that includes an IC package 101 and a PCB 106. FIGS. 1B and 1C each illustrates a top view, e.g., the x-y view, of the apparatus 100.

The IC package 101 includes an IC chip 102, or a combination of IC chips or discrete components. In some implementations, the IC package 101 is a package used in a network switch, e.g., a SerDes, as described above. In some other implementations, the IC package 101 is any suitable packaged device or a part of a device, or a part of a system, including but not limited to: routers, televisions, displays, desktop computers, laptop computers, tablets, and mobile devices such as smartphones, wearable devices, and media devices.

The IC package 101 also includes a substrate 104, and a ball grid array (BGA) 108. The IC chip 102 is coupled to a surface, e.g., a top surface, of the substrate 104. The BGA 108 is coupled to a surface, e.g., a bottom surface, of the substrate 104. The IC package 101 and the PCB 106 are coupled through the BGA 108. In some implementations, the IC package 101 further includes any suitable components such as a heat sink.

The IC chip 102 is a silicon die that includes circuitry for one or more specific functions. In some implementations, the IC chip 102 is a transmitter that generates, modulates, and outputs multi-channel signals, or a receiver that receives and detects multi-channel signals from an external data path. In some implementations, the IC chip is a transreceiver that (i) generates, modulates and outputs signals and (ii) receives and detects signals from an external data path. In some implementations, the IC chip 102 includes input and output pins of a networking switch, e.g., SerDes input and output pins, where data are communicated using pairs of differential signals. In some implementations, the IC chip 102 includes a system on chip (SoC).

The substrate 104 includes circuitry that establishes electrical couplings between the IC chip 102 and the PCB 106. In some implementations, the substrate 104 includes a multilayer lamination of one or more ground layers, one or more power layers, or signal layers. The IC chip 102 may be flip-chip bonded or wire-bonded to the substrate 104. The substrate 104 can include bonding pads that are coupled to solder balls of the BGA 108. The substrate 104 is coupled to the PCB 106 through the solder balls of the BGA 108.

The BGA 108 includes an array of multiple solder balls. The solder balls of the BGA 108 couple the substrate 104 to the PCB 106. In particular, each solder ball of the BGA 108 couples a bonding pad of the substrate 104 to a bonding pad of the PCB 106. For example, transmit signals are transferred from the IC chip 102 through the bonding pad of the substrate, the solder ball of the BGA 108, and the bonding pad of the PCB 106. Each bonding pad of the PCB 106 is coupled to at least one via of the PCB 106. The bonding pad of the PCB is coupled to one or more signal layers of the PCB through the vias to transfer transmit signals and receive signals. For example, the transmit signals are electric signals transferred from the IC chip 102 to one or more external devices through the vias and the signal layers and the receive signals are electric signals transferred from the one or more external devices to the IC chip 102 in a reverse order. That is, the receive signals are transferred from the external devices to the IC chip 102 through signal layers of the PCB 106, vias of the PCB 106, bonding pads of the PCB 106, solder balls of the BGA 108, and bonding pads of the substrate 104. In some implementations, the signals are differential pairs of signals. In some other implementations, the signals are single-ended signals.

In some implementations, the solder balls of the BGA 108 are coupled to dog bone patterns of the PCB 106. Each dog bone pattern of the PCB 106 includes a bonding pad, one or more vias, and one or more coupling portions that couple the bonding pad to the one or more vias. For example, the one or more coupling portions extend in the x-y plane of FIG. 1A. A solder ball of the BGA 108 is coupled to a bonding pad of a dog bone pattern. In some other implementations, the solder balls of the BGA 108 are coupled to solder pad patterns of a PCB. Each solder ball pattern of the PCB includes a via. A solder ball of the BGA 108 is coupled to a via of a solder ball pattern. In some other implementations, the solder balls of the BGA 108 are coupled to via in pad patterns of a PCB. Each via in pad pattern of the PCB includes a bonding pad, a via, and a coupling portion that couples the bonding pad to the via. For example, the coupling portions extend in the y-z plane of FIG. 1A.

The solder balls are arranged in three different sections of the BGA 108. The solder balls include first solder balls, e.g., 122a, 122b, 123a, 123b, 124a and 124b, arranged in a first section A1 of the BGA 108, second solder balls, e.g., 152a, 152b, 153a, 153b, 154a and 154b, arranged in a second section A2 of the BGA 108, and third solder balls, e.g., 126 and 128, arranged in a third section A3 of the BGA 108.

Referring to FIG. 1B, which illustrates a top view, e.g., the x-y view, of the apparatus 100, the solder balls of the BGA 108 are covered under the substrate 104. An area 121 of the BGA 108 that is covered by the IC chip 102 includes solder balls that provide coupling for power signals including digital and analog power signals, ground, or design for testability (DFT) signals. In some implementations, the area 121 of the BGA 108 is within the perimeter of the IC chip 102. In some other implementations, the area 121 of the BGA 108 extends outside the perimeter of the IC chip 102. The solder balls for transferring differential signals can be arranged in areas 104a-104d outside the area 121 of the BGA 108.

The BGA solder balls for transferring differential signals in the area 104a can be routed to exit the PCB 106 in the −x or in the +y direction. The BGA solder balls for transferring differential signals in the area 104b can be routed to exit the PCB 106 in the −x or in the −y direction. The BGA solder balls for transferring differential signals in the area 104c can be routed to exit the PCB 106 in the +x or in the +y direction. The BGA solder balls for transferring differential signals in the area 104d can be routed to exit the PCB 106 in the +x or in the −y direction.

Referring to FIG. 1C, which also illustrates a top view, e.g., the x-y view, of the apparatus 100, the first section A1 of the BGA 108 represents a section of the BGA 108 located between a first border 103 and a second border 105. As shown, the first section A1 is located farther away from the area 121 of the BGA 108 than the second section A2. The first solder balls arranged in the first section A1 transfer pairs of differential signals between the substrate 104 and the PCB 106. The second section A2 of the BGA 108 represents a section of the BGA 108 located between a third border 107 and a perimeter of the IC chip 102. The second solder balls arranged in the second section A2 transfer pairs of differential signals between the substrate 104 and the PCB 106. In some implementations, the first solder balls in the first section A1 transfer the transmit signals from the chip 102 to one or more external devices through the PCB 106, and the second solder balls in the second section A2 transfer receive signals from the external devices the IC chip 102 through the PCB 106. For example, the transmit signals and the receive signals include control signals or data for specific functions. In some other implementations, the first solder balls in the first section A1 transfer receive signals and the second solder balls in the second section A2 transfer transmit signals.

The third section A3 of the BGA 108 represents a section of the BGA 108 located between the second border 105 and the third border 107. That is, the third section A3 is located between the first section A1 and the second section A2. The third solder balls arranged in the third section A3 provide a grounding path for the substrate 104 through the PCB 106.

Referring back to FIG. 1A, the first solder balls 122a, 122b, 123a, 123b in the first section A1 transfer pairs of differential signals. The second solder balls 152a, 152b, 153a, 153b in the second section A2 also transfer pairs of differential signals. In some implementations, the second solder balls transfer pairs of differential signals complementary to the pairs of differential signals transferred by the first solder balls.

In some implementations, the first solder balls transfer transmit signals that are sent from the IC chip 102 to the PCB 106. For example, the first solder balls 122a, 122b transfer a pair of differential signal from the IC chip 102 to the PCB 106 and the first solder balls 123a, 123b transfer another pair of differential from the IC chip 102 to the PCB 106. In these implementations, the second solder balls transfer receive signals sent from the PCB 106 to the IC chip 102 while the first solder balls transfer transmit signals sent from the IC chip 102 to the PCB 106. The second solder balls 152a, 152b transfer a pair of differential signal from the PCB 106 to the IC chip 102 and the second solder balls 153a, 153b transfer another pair of differential from the PCB 106 to the IC chip 102. In some other implementations, the first solder balls transfer receive signals and the second solder balls transfer transmit signals.

In some implementations, the PCB 106 includes a multilayer lamination of signal layers, one or more power layers, and one or more ground layers. For example, the PCB 106 includes M (where M is an integer >0) layers of circuitry, including signal layers 111, 112, 115, 116, ground layers 113, 114, and 117, and layer 118. In some implementations, the PCB 106 includes up to 28 layers of circuity (here M=28). However, the number of layers of circuity is not limited to a particular number in different implementations. The PCB 106 can include any suitable number of layers of circuity in various implementations. In some implementations, a ground layer is provided between two signal layers. For example, in some implementations, an additional ground layer is provided between the signal layers 111 and 112.

In some implementations, different pairs of first solder balls transfer transmit signals through different signal layers. For example, the first solder balls 122a, 122b transfer a pair of differential signals from the IC chip 102 through the signal layer 112 and the first solder balls 123a, 123b transfer another pair of differentials from the IC chip 102 through the different signal layer 111. The second solder balls transfer pairs of differential signals that are different from the pairs of differential signals transferred by the first solder balls. That is, different pairs of second solder balls transfer receive signals through different signal layers. For example, the second solder balls 152a, 152b transfer a pair of differential signals to the IC chip 102 through the signal layer 116 and the second solder balls 153a, 153b transfer another pair of differentials to the IC chip 102 through the different signal layer 115. In some other implementations, the first solder balls transfer receive signals and the second solder balls transfer transmit signals.

In some implementations, different pairs of first solder balls transfer transmit signals through a same signal layer. For example, the first solder balls 122a, 122b transfer a pair of differential signals from the IC chip 102 through the signal layer 111 and the first solder balls 124a, 124b transfer another pair of differential signals from the IC chip 102 through the same signal layer 111. The second solder balls transfer pairs of differential signals that are different from the pairs of differential signals transferred by the first solder balls. That is, different pairs of second solder balls transfer receive signals through a same signal layer. For example, the second solder balls 152a, 152b transfer a pair of differential signals to the IC chip 102 through the signal layer 116 and the second solder balls 154a, 154b transfer another pair of differential signals to the IC chip 102 through the same signal layer 116. In other implementations, the first solder balls transfer receive signals and the second solder balls transfer transmit signals.

The first solder balls in the first section A1, the second solder balls in the second section A2, and the third solder balls in the third section A3 couple the substrate 104 to the PCB 106. In particular, each first solder ball and each second solder ball couples a bonding pad of the substrate 104 to a via of the PCB 106 through a bonding pad of the PCB 106. For example, each of the first solder balls 122a, 122b, arranged in the first section A1 is respectively coupled to a single via of the vias 132a, 132b; and each of the second solder balls 152a, 152b, 153a, 153b, arranged in the second section A2 is respectively coupled to a single via of the vias 162a, 162b, 163a, 163b.

Each third solder ball couples a bonding pad of the substrate 104 to two or more vias of the PCB 106 through a bonding pad of the PCB 106. For example, the third solder ball 126 arranged in the third section A3 is coupled to two vias 146a, 146b. In some implementations, the third solder ball is coupled to more than two vias of the PCB 106. Coupling the third solder balls to the vias are described in greater detail below.

The PCB 106 includes (i) multiple bonding pads on a surface of the PCB 106 that is exposed to the IC package 101 and (ii) multiple vias that are coupled to the bonding pads. In some implementations, the PCB 106 includes dog bone patterns. A dog bone pattern of the PCB 106 includes a bonding pad of the multiple bonding pads, one or more vias of the multiple vias, and one or more coupling portions that couple the bonding pad to the one or more vias. In some other implementations, the PCB 106 includes solder pad patterns described above. In some other implementations, the PCB 106 includes via in pad patterns described above.

In some implementations, the PCB 106 further includes a multilayer lamination of signal layers, one or more power layers, and one or more ground layers. The multiple vias can be formed, either fully or in part, through the multilayer lamination of layers. For example, the PCB 106 includes signal layers 111, 112, 115, 116, ground layers 113, 114, 117, and a power layer 118. In some implementations, one or more ground layers that are coupled to a reference voltage are stacked above or below a signal layer. For example, the ground layer 113 is stacked between the signal layer 112 for transferring a transmit signal and the signal layer 115 for transferring a receive signal. As another example, a ground layer 117 is stacked between the signal layers 115, 116 for transferring receive signals. The ground layer 113 electrically separates two signal layers, e.g., signal layers 112 and 115, from each other. The ground layer can reduce or eliminate noise, e.g., crosstalk, that occurs between the signal layers by transferring noise to ground.

In some implementations, each layer of the multilayer lamination includes circuitry for one or more specific functions. For example, the layer 112 includes conductive traces that provide a route to transfer a pair of differential signals between the substrate 104 and the PCB 106 through vias 132a and 132b and respective BGA solder balls 122a and 122b. As another example, the layer 112 further includes conductive traces that provide a different route to transfer another pair of differential signals between the substrate 104 and the PCB 106 through vias 134a, 134b and respective BGA solder balls 124a, 124b. As another example, the layer 118 includes conductive traces that provide a power signal, e.g., an analog power signal, to the substrate 104 through a via 136 and a corresponding BGA solder ball 126. As another example, the layer 113 includes conductive traces that provide a grounding path to ground for the substrate 104 through a via 145 and a corresponding BGA solder ball 127.

In some implementations, back-drilled holes are formed by a process, such as back drill or counter-boring, to remove portions of vias. In particular, the back-drilled holes are formed by removing portions of vias that transfer pairs of differential signals. For example, the back-drilled holes 142a and 142b are formed by removing portions of the vias 132a and 132b, respectively to improve the quality of the transmit signals transferred through the signal layer 112. As another example, the back-drilled holes 143a, 143b are formed by removing portions of the vias 163a, 163b, respectively to improve the quality of the receive signals transferred through the signal layer 115. In some implementations, the back-drilled holes are not formed in vias that are coupled to ground to save cost. For example, the third vias 146a, 146b that are coupled to ground do not have back-drilled holes. However, in some other implementations, back-drilled holes are formed in vias that are coupled to ground to provide a grounding path. In some implementations, the back-drilled holes are non-conductive. Non-conductive back-drilled holes reduce signal reflection induced within the vias and improve the quality of the signals.

In some implementations, the back-drilled holes reduce or eliminate crosstalk between different pairs of differential signals. For example, the back-drilled holes 142a, 142b reduce or eliminate crosstalk between differential signals that are transferred through the signal layer 112 and differential signals that are transferred through the signal layers 115, 116 because no electrical signal that is transferred through the vias 132a, 132b is coupled with the signal layers 115, 116. As another example, the back-drilled holes 143a and 143b reduce or eliminate crosstalk between differential signals that are transferred through the signal layer 115 and differential signals that are transferred through the signal layer 116 because no electrical signal that is transferred through the vias 163a and 163b is coupled with the signal layer 116.

In some implementations, the multilayer lamination includes a first multilayer lamination M1 and a second multilayer lamination M2. In FIG. 1A, the first multilayer lamination M1 includes layers 111-114 and the second multilayer lamination M2 includes layers 115-118. The first multilayer lamination M1 and the second multilayer lamination M2 can respectively transfer different types of differential signals. For example, the first multilayer lamination M1 transfers transmit signals from the IC chip 102 through the signal layers 111, 112 and the second multilayer lamination M2 transfers receive signals to the IC chip 102 through the signal layers 115, 116. By separating the signal layers, crosstalk between the transmit signals and the receive signals can be reduced or eliminated. In some implementations, the first multilayer lamination M1 can transfer receive signals to the IC chip 102 through the signal layers 111, 112 and the second multilayer lamination M2 can transfer transmit signals from the IC chip 102 through the signal layers 115, 116.

In some implementations, the bottom layer 113 of the first multilayer lamination M1 that is coupled to the top layer 115 of the second multilayer lamination M2 is a ground layer to enhance the separation between the first multilayer lamination M1 and the second multilayer lamination M2. In some implementations, the top layer of the second multilayer lamination M2 that is coupled to the bottom layer of the first multilayer lamination M1 is a ground layer to enhance the separation between the first multilayer lamination M1 and the second multilayer lamination M2.

The bonding pads of the PCB 106 couple the solder balls of the BGA 108 to the vias of the PCB 106. The bonding pads of the PCB 106 are arranged in three different areas of the PCB 106. The bonding pads include first bonding pads arranged in the first area corresponding to the first section A1 of the BGA 108, second bonding pads arranged in the second area corresponding to the second section A2 of the BGA 108, and third bonding pads arranged in the third area corresponding to the third section A3 of the BGA 108. In some implementations, the first bonding pads in the first area transfer transmit signals sent from the chip 102 to the PCB 106 and the second bonding pads in the second area transfer receive signals sent from the PCB 106 to the IC chip 102. In some implementations, the first bonding pads in the first area transfer receive signals sent from the PCB 106 to the chip 102 and the second bonding pads in the second area transfer transmit signals sent from the chip 102 to the PCB 106.

As the third section A3 is located between the first section A1 and the second section A2, the third area corresponding to the third section A3 is located between the first area corresponding to the first section A1 and the second area corresponding the second section A2. The third bonding pads arranged in the third area are coupled to ground through two or more vias to provide a grounding path for the PCB 106. In particular, each of the third bonding pads is coupled to the two or more vias to separate a grounding path for a signal transferred through the first bonding pads from a grounding path for a signal transferred through the second bonding pads. For example, a grounding path for a signal, e.g., a transmit signal, transferred through the first bonding pads is provided through one via of the two or more vias and a grounding path for a signal, e.g., a receive signal, transferred through the second bonding pads is provided through another via of the two or more vias. Thus, by separating the grounding paths, the crosstalk between the signals can be reduced or eliminated.

The first bonding pads of the PCB 106 respectively couples the first solder balls of the BGA 108 to the first vias of the PCB 106. In particular, each first bonding pad of the PCB 106 is coupled to a single first via of the PCB 106. For example, the first bonding pads of the PCB 106 that are respectively coupled to the first solder balls 122a, 122b are coupled to the first vias 132a, 132b.

The first bonding pads of the PCB 106 transfer pairs of differential signals or single ended signals. The first bonding pads can transfer transmit signals sent from the IC chip 102 to the PCB 106 as illustrated in FIG. 1A. In FIG. 1A, the first bonding pads that are respectively coupled to the first solder balls 122a, 122b transfer a pair of differential signal from the IC chip 102 to the first vias 132a, 132b.

In some implementations, different pairs of first bonding pads transfer transmit signals through different signal layers.

For example, the first bonding pads that are respectively coupled to the first solder balls 122a, 122b transfer a pair of differential signals from the IC chip 102 through the signal layer 112 and the first bonding pads that are respectively coupled to the first solder balls 123a, 123b transfer another pair of differentials from the IC chip 102 through the signal layer 111 that is a different signal layer from the signal layer 112. In some implementations, different pairs of first bonding pads transfer transmit signals through a same signal layer. For example, the first bonding pads that are respectively coupled to the first solder balls 122a, 122b transfer a pair of differential signals from the IC chip 102 through the signal layer 111 and the first bonding pads that are respectively coupled to the first solder balls 124a, 124b transfer another pair of differential signals from the IC chip 102 through the same signal layer 111.

The second bonding pads of the PCB 106 respectively couple the second solder balls of the BGA 108 to the second vias of the PCB 106. In particular, each second bonding pad of the PCB 106 is coupled to a single second via of the PCB 106. For example, the second bonding pads of the PCB 106 that are respectively coupled to the second solder balls 152a, 152b are coupled to the second vias 162a, 162b.

The second bonding pads of the PCB 106 transfer pairs of differential signals. The second bonding pads can transfer receive signals sent from the PCB 106 to the IC chip 102 as illustrated in FIG. 1A. In FIG. 1A, the second bonding pads that are respectively coupled to the second solder balls 152a, 152b transfer a pair of differential signal from the second vias 162a, 162b to the IC chip 102 and the second bonding pads that are respectively coupled to the second solder balls 153a, 153b transfer another pair of differential from the second vias 163a, 163b to the IC chip 102.

In some implementations, different pairs of second bonding pads transfer receive signals through different signal layers. For example, the second bonding pads that are respectively coupled to the second solder balls 152a, 152b transfer a pair of differential signals to the IC chip 102 through the signal layer 116 and the second bonding pads that are respectively coupled to the second solder balls 153a, 153b transfer another pair of differentials signals to the IC chip 102 through the signal layer 115 that is a different signal layer from the signal layer 116. In some implementations, different pairs of second bonding pads transfer receive signals through a same signal layer. For example, the second bonding pads that are respectively coupled to the second solder balls 152a, 152b transfer a pair of differential signals to the IC chip 102 through the signal layer 115 and the second bonding pads that are respectively coupled to the second solder balls 154a, 154b transfer another pair of differential signals to the IC chip 102 through the same signal layer 115.

The third bonding pads of the PCB 106 respectively couple the third solder balls of the BGA 108 to the third vias of the PCB 106. In particular, each third bonding pad of the PCB 106 is coupled to two or more third vias of the PCB 106. For example, a single third bonding pad of the PCB 106 that is coupled to the third solder ball 126 is coupled to two third vias 146a, 146b. The third bonding pads of the PCB 106 are coupled the two third vias 146a, 146b to provide a grounding path. In some implementations, the third bonding pads of the PCB 106 transfer power signals between the substrate 104 and the PCB 106. In some implementations, the third bonding pads of the PCB 106 provide coupling for power signals and ground. For example, one group of the third bonding pads transfer power signals between the substrate 104 and the PCB 106 and the other group of the third bonding pads are coupled to ground to provide a grounding path.

The third vias coupled to the third bonding pads of the PCB 106 isolate the first vias coupled to the first bonding pads of the PCB 106 from the second vias coupled to the second bonding pads of the PCB 106. For example, the third vias 146a, 146b are located between the first vias 132a, 132b and the second vias 163a, 163b. In this example, the third vias 146a, 146b provide a grounding path to ground. By being coupled to ground, the third vias 146a, 146b can reduce or eliminate noise, e.g., crosstalk, that occur between the first vias 132a, 132b and the second vias 163a, 163b by transferring noise to ground. For example, a third bonding pad that is coupled to the two third vias 146a and 146b provide a greater physical separation between the first via 132b and the second via 163a, compared to a case where only a single ground via is present between the first and second vias. Due to the greater physical separation between the first vias 132a, 132b and the second vias 163a, 163b, the crosstalk between the signals transferred through the first vias 132a, 132b and the signals transferred through the second vias 163a, 163b is reduced or eliminated. In this manner, the crosstalk can be more efficiently reduced or eliminated. By reducing the crosstalk, the PCB 106 can transfer signals at a higher sampling rate. For example, the PCB 106 transfers differential signals having a sampling rate of at least 56 Gb/sec while maintaining a Nyquist frequency.

Figure 2A:
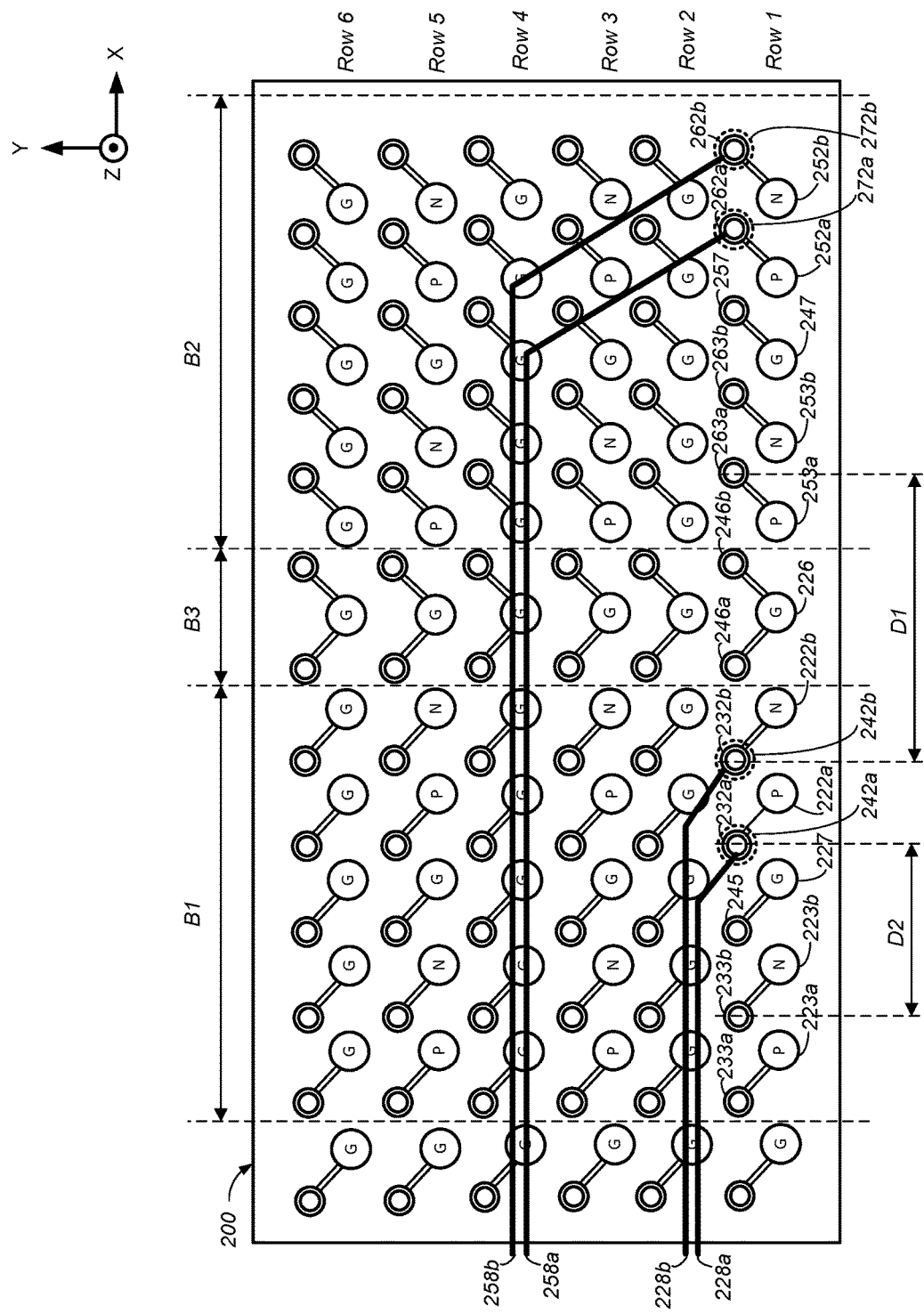
FIG. 2A is a diagram illustrating an example PCB region, where the PCB region includes a bonding pad pattern to increase separation between receive and transmit vias.

FIG. 2A illustrates an example PCB region 200, where the PCB region 200 includes a bonding pad pattern to increase separation between receive and transmit vias. The PCB region 200 includes bonding pads for transferring multiple pairs of differential signals through a BGA, e.g., the BGA 108. For example, the PCB region 200 is located at one of the areas 104a-104d described with reference to FIGS. 1B and 1C. In FIG. 2A, the bonding pad pattern is a dog bone pattern. In some implementations, the PCB region 200 includes dog bone patterns described above. In some other implementations, the PCB region 200 includes solder pad patterns or via in pad patterns described above The PCB region 200 includes multiple vias and bonding pads. The bonding pads are respectively coupled to solder balls of the BGA to provide coupling for differential signals, ground, or power signals. A bonding pad P refers to a bonding pad that transfers a positive signal of a pair of differential signals, a bonding pad N refers to a bonding pad that transfers a negative signal of a pair of differential signals, and a bonding pad G refers to a bonding pad that is coupled to ground to provide a grounding path. In this example, the bonding pads 222a, 222b, 223a, 223b arranged in the first area B1 can be the first bonding pads 122a, 122b, 123a, 123b described with reference to FIGS. 1A to 1C. The bonding pads 252a, 252b, 253a, 253b arranged in the second area B2 can be the second bonding pads 152a, 152b, 153a, 153b described with reference to FIGS. 1A to 1C. The bonding pad 226 arranged in the third area B3 can be the third bonding pad 126 described with reference to FIGS. 1A to 1C.

The first bonding pads in the third area B3 are respectively coupled to first vias, e.g., transmit vias that transfer transmit signals, of the PCB. In particular, each first bonding pad is coupled to a single first via. In some implementations, the first bonding pad is coupled to the first via as a dog bone pattern. For example, the first bonding pad 222a and the first via 232a form one dog bone pattern. The first bonding pad 222a is coupled to a first via 232a to transfer a positive signal P of a differential signal pair and the first bonding pad 222*b* is coupled to a second via 232*b* to transfer a negative signal N of a differential signal pair. In addition, the first bonding pads 223*a*, 223*b* are respectively coupled to the first vias 233*a*, 233*b* to transfer another pair of differential signals.

As described previously, the first vias are coupled to conductive signal traces formed on one or more signal layers to transfer differential signals. For example, the conductive signal traces are formed on the signal layers 111, 112 described with reference to FIG. 1A. In some implementations, the conductive signal traces transfer differential signals that are transferred from the IC chip 102 through the first solder balls, the first bonding pads, and the first vias. For example, the conductive signal trace 228*a* transfers the positive signal P of a differential signal pair that is transferred from the first solder ball through the first bonding pad 222*a* and the first via 232*a*. The conductive signal trace 228*b* transfers the negative signal N of the differential signal pair that is transferred from the first solder ball through the first bonding pad 222*b* and the first via 232*b*. In some implementations, the conductive traces 228*a*, 228*b* are formed on a same signal layer, e.g., 112. In some implementations, the conductive traces 228*a*, 228*b* are respectively formed on a different signal layer, e.g., 111 and 112.

In some implementations, the conductive signal traces transfer differential signals to the IC chip through the first vias, the first bonding pads, and the first solder balls. In some implementations, back-drilled holes 242*a*, 242*b* are formed from the back of the PCB region 200 to reduce reflections for the first vias 232*a*, 232*b*, respectively. In some implementations, the first vias 232*a*, 232*b* are separated from the first vias 233*a*, 233*b* by the via 245 that is coupled to a bonding pad 227. The via 245 is coupled to ground to provide a grounding path. Thus, the via 245 can reduce or eliminate noise, e.g., crosstalk, that occurs between the first vias 232*a*, 232*ab* and the first vias 233*a*, 233*b* by transferring noise to ground through the via 245.

The second bonding pads in the second area B2 are respectively coupled to second vias, e.g., receive vias that transfer receive signals, of the PCB. In particular, each second bonding pad is coupled to a single second via. In some implementations, the second bonding pad is coupled to the second via as a dog bone pattern. For example, the second bonding pad 252*a* and the second via 252*a* form one dog bone pattern. The second bonding pad 252*a* is coupled to a second via 262*a* to transfer a positive signal P of a differential signal pair and the second bonding pad 252*b* is coupled to a second via 262*b* to transfer a negative signal N of a differential signal pair. In addition, the second bonding pads 253*a*, 253*b* are respectively coupled to the second vias 263*a*, 263*b* to transfer another pair of differential signals.

The second vias are coupled to conductive signal traces formed on one or more signal layers to transfer differential signals. For example, the conductive signal traces are formed on the signal layers 115, 116 described with reference to FIG. 1A. In some implementations, the conductive signal traces transfer differential signals to the IC chip through the second vias, the second bonding pads, and the second solder balls. For example, the conductive signal trace 258*a* transfers the positive signal P of a differential signal pair to the IC chip through the second via 262*a*, the second bonding pad 252*a*, and the second solder. The conductive signal trace 258*b* transfers the negative signal N of the differential signal pair to the IC chip through the second via 262*b*, the second bonding pad 252*b*, and the second solder. In some implementations, the conductive signal traces 258*a*, 258*b* are formed on a same signal layer, e.g., 115. In some implementations, the conductive signal traces 258*a*, 258*b* are respectively formed on a different signal layer, e.g., 115 and 116.

In some implementations, the conductive signal traces transfer differential signals from the IC chip through the second solder balls, the second bonding pads, and the second vias. In some implementations, back-drilled holes 272*a*, 272*b* are formed from the back of the PCB region 200 to reduce reflections for the second vias 262*a*, 262*b*, respectively. In some implementations, the second vias 262*a*, 262*b* are separated from the second vias 263*a*, 263*b* by the via 257 that is coupled to a bonding pad 247. The via 257 is coupled to ground to provide a grounding path for the bonding pad 247. Thus, the via 257 can reduce or eliminate noise, e.g., crosstalk, that occurs between the second vias 262*a*, 262*b* and the second vias 233*a*, 233*b* by transferring noise to ground through the via 257.

The third bonding pads in the third area B3 are respectively coupled to third vias of the PCB. In particular, each third bonding pad is coupled to two or more third vias. In some implementations, the third bonding pad is coupled to the third vias as a dog bone pattern. For example, the third bonding pad 226 and the third vias 246*a*, 246*b* form one dog bone pattern. In the illustrated example, the dog bone pattern including the third bonding pad 226 and the third via 246*a* is oriented 270 degrees relative to the dog bone pattern including the second bonding pad 253*a* and the second via 263*a* in a counterclockwise direction. The dog bone pattern including the third bonding pad 226 and the third via 246*a* is oriented 360 degrees relative to the dog bone pattern including the first bonding pad 222*b* and the first via 232*b* in a clockwise direction. Moreover, the dog bone pattern including the third bonding pad 226 and the third via 246*b* is oriented 270 degrees relative to the dog bone pattern including the first bonding pad 222*b* and the first via 232*b* in a clockwise direction. The dog bone pattern including the third bonding pad 226 and the third via 246*b* is oriented 360 degrees relative to the dog bone pattern including the second bonding pad 253*a* and the second via 263*a* in a counterclockwise direction. However, the degree between the dog bone pattern including the third bonding pad and the third via and the dog bone pattern including the second bonding pad and the second via or the degree between the dog bone pattern including the third bonding pad and the third via and the dog bone pattern including the second bonding pad and the second via are described as examples and are not limited to a particular value. Any suitable values of degrees can be used for different implementations.

The third bonding pad 226 is coupled to ground through two third vias 246*a*, 246*b*. The third vias coupled to the third bonding pads electrically isolate the first vias coupled to the first bonding pads from the second vias coupled to the second bonding pads. For example, the third vias 246*a*, 246*b* that are coupled to ground electrically isolate the first vias 232*a*, 232*b* and the second vias 263*a*, 263*b*. Comparing to the single ground via 245 providing electrical isolation between the pair of the first vias 232*a*, 232*b* and the pair of the first vias 233*a*, 233*b*, the two third vias 246*a*, 246*b* provide greater electrical isolation between the first vias 232*a*, 232*b* and the second vias 263*a*, 263*b* because the distance D1 between the first via 232*b* and the second via 263*b* is larger than the distance D2 between the first via 232*a* and the first via 233*b*. In particular, the crosstalk between the first vias 232*a*, 232*b* and the second vias 263*a*, 263*b* is greater than the crosstalk between the first vias 232*a*, 232*b* and the first vias 233*a*, 233*b* because the first vias 232*a*, 232*b* and the second vias 263*a*, 263*b* transfer different types of signals, e.g., transmit signals and receive signals, while the first vias 232a, 233b transfer a same type of signals, e.g., transmit signals. Thus, by arranging the two third vias 246a, 246b between the first vias 232a, 232b and the second vias 263a, 263b, the PCB region 200 provides greater isolation to reduce or eliminate the crosstalk between the first vias 232a, 232b and the second vias 263a, 263b. In addition, by reducing the crosstalk, the PCB can transfer signals at a higher sampling rate without altering a Nyquist frequency. For example, the PCB can transfer differential signals having a sampling rate of at least 56 Gb/sec while maintaining a Nyquist frequency.

In some implementations, each of the first bonding pads is coupled to two or more first vias to provide greater electrical isolation between pairs of the first vias. In some implementations, each of the second bonding pads is coupled to two or more second vias to provide greater electrical isolation between pairs of the second vias. In some other implementations, each of both the first bonding pads and the second bonding pads is coupled to two or more first vias or two or more second vias to provide greater electrical isolation between pairs of the first vias or pairs of the second vias.

In some implementations, the bonding pads in the PCB region 200 are arranged in multiple rows, e.g., Rows 1-6 as illustrated in FIG. 2. In this example, the first row, Row 1, includes bonding pads for providing coupling for differential signals, ground, or power signals. The second row, Row 2, that is adjacent to Row 1 includes bonding pads coupled to ground. That is, rows for providing coupling to differential signals and rows for providing coupling to ground are alternatively arranged. This arrangement can reduce or eliminate crosstalk between the differential signals transferred through the bonding pads in Row 1 and the differential signals transferred through the bonding pads in the third row, Row 3, by separating the two rows Row 1 and Row 3 using the ground vias coupled to the bonding pads in Row 2. In some implementations, each row of the multiple rows includes bonding pads for transferring differential signals.

Figure 2B:
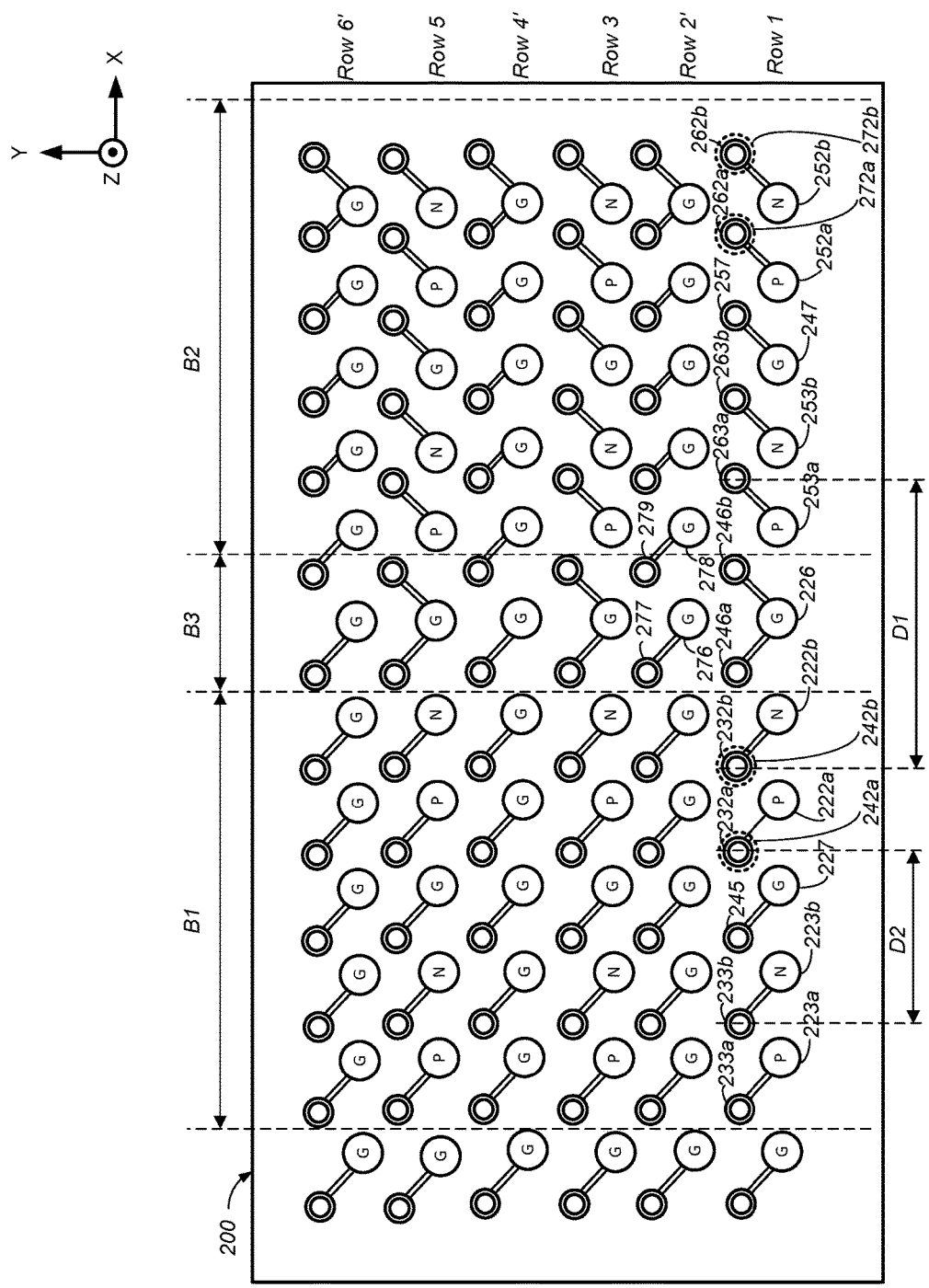
FIG. 2B is a diagram illustrating another example PCB region, where the PCB region includes a bonding pad pattern to increase separation between receive and transmit vias.

FIG. 2B illustrates another example PCB region 200, where the PCB region 200 includes a bonding pad pattern to increase separation between receive and transmit vias. In some implementations, the bonding pad pattern is a dog bone pattern.

As shown in FIG. 2B, the PCB region includes rows, e.g., Row 1-6' of bonding pads. Some of the rows, e.g., Row 1, Row 3, Row 5, including bonding pads for providing coupling for differential signals, ground, or power signals have the same dog bone patterns as the rows, e.g., Row 1, Row 3, Row 5, illustrated in FIG. 2A. Other rows, e.g., rows Row, 2', Row 4', Row 6', including bonding pads coupled to ground have different dog bone patterns from the rows, e.g., Row 2, Row 4, Row 6, illustrated in FIG. 2A. For example, Row 2' in FIG. 2B includes multiple ground bonding pads G that are respectively coupled to the vias. In particular, each ground bonding pad G in the third area B3 is coupled to a single via. For example, the ground bonding pad 276 in the third area B3 is coupled to a single via 277 that is coupled to ground. The ground bonding pad 278 in the second area B2 is coupled to a single via 279 in the third area B3.

In this specification, the bonding pad patterns illustrated in FIGS. 2A and 2B are examples of various dog bone patterns. Any suitable types of bonding pad patterns can also be applied to implement the PCB region 200.

Figure 3:
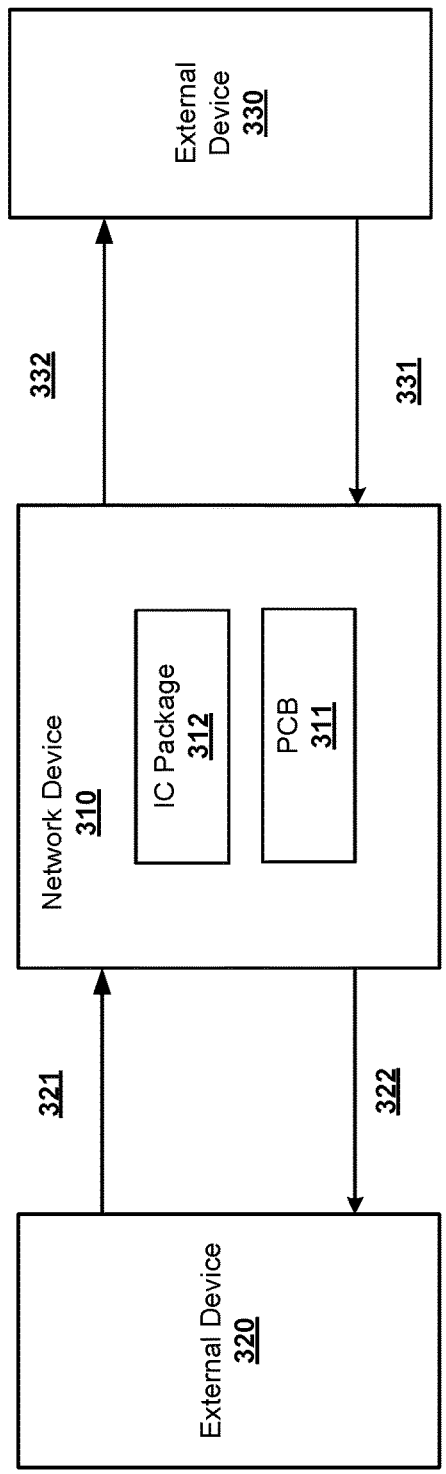
FIG. 3 is a diagram illustrating an example network device that includes an IC package and a PCB employing a bonding pad pattern to increase separation between receive and transmit vias.

FIG. 3 is a diagram illustrating an example network device that includes an IC package and a PCB employing a bonding pad pattern to increase separation between receive and transmit vias. For example, the network device 310 can be a network switch or a router. In some implementations, the IC package 312 is the IC package 101 and the PCB 311 is the PCB 106.

The network device 310 transmits and receives signals to or from one or more external devices, e.g., external devices 320, 330. In some implementations, the network device 310 receives a signal 321 from the external device 320 and transmits a signal 322 to the external device 320. The receive signal 321 is transferred to the IC package 312 through the PCB 311. The IC package 312 transmits the signal 322 to the external device 320 through the PCB 311. In some implementations, the network device 310 receives a signal 331 from the external device 330 and transmits a signal 332 to the external device 330. In some implementations, the IC package 312 transmits a signal 332 to a different external device, e.g., 330, in response to the receive signal 321. In some implementations, the IC package 312 transmits a signal without specifying a particular external device.

The PCB 311 acts as a conduit to transfer I/O signals including the transmit signals 322 that are transferred from the IC package 312 to the external devices 320, 330 or systems, and the receive signals 321, 331 that are transferred from the external devices 320, 330 or systems to the IC package 312. For example, the PCB 311 acts as a host for the IC chip of the IC package 312 and connects the IC chip to other one or more IC chips of IC packages hosted by other PCBs of the external devices 320, 330.

As described above, the PCB 311 and the IC package 312 increase separation between I/O signals. As a result, the crosstalk between I/O signals can be reduced or eliminated. Thus, the network device 310 including the PCB 311 and the IC package 312 can transfer I/O signals at a higher sampling rate without altering Nyquist frequency, thereby enabling high speed signal processing. For example, the network device 310 transmits and receives signals having an amplitude between 50 mV and 5 V at a sampling rate between 1 Gb/s and 100 Gb/s. As another example, the network device 310 transmits and receives signals having an amplitude between 50 mV and 5 V at a sampling rate between 100 Gb/s and 500 Gb/s. In some implementations, an amplitude of a receive signal is different from an amplitude of a transmit signal. In some implementations, a sampling rate of a receive signal is different from a sampling rate of a transmit signal. However, the amplitudes and the sampling rates of the IC package are described as examples and are not limited to a particular range. Any suitable range of an amplitude and a sampling rate can be used for different implementations.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination. Various implementations may have been discussed using two-dimensional cross-sections for easy description and illustration purpose. Nevertheless, the three-dimensional variations and derivations should also be included within the scope of the disclosure.

Similarly, while operations are depicted in the drawings in a particular order, this should not be understood as requiring that such operations be performed in the particular order shown or in sequential order, or that all illustrated operations be performed, to achieve desirable results.

Thus, particular embodiments have been described. Other embodiments are within the scope of the following claims. For example, the actions recited in the claims may be performed in a different order and still achieve desirable results.

What is claimed is:

1. An apparatus comprising:
   a printed circuit board that includes:
      a multilayer lamination of one or more ground layers, one or more power layers, and a plurality of signal layers;
      a plurality of vias that are located on a first surface of the printed circuit board; and
      a plurality of bonding pads that couple a ball grid array of an integrated circuit package to the one or more ground layers, the one or more power layers, and the plurality of signal layers through the plurality of vias, wherein the plurality of bonding pads includes:
         first bonding pads that are arranged in a first area of the printed circuit board and that are configured to transfer multiple pairs of first differential signals between the printed circuit board and the integrated circuit package, each of the first bonding pads being coupled to a via of the plurality of vias in the first area,
         second bonding pads that are arranged in a second area of the printed circuit board and that are configured to transfer multiple pairs of second differential signals between the printed circuit board and the integrated circuit package, each of the second bonding pads being coupled to a via of the plurality of vias in the second area, and
         third bonding pads that are arranged in a third area of the printed circuit board and that couple the integrated circuit package to ground of the printed circuit board, each of the third bonding pads being coupled to two or more vias of the plurality of vias in the third area,
      wherein the third area is located between the first area and the second area.

2. The apparatus of claim 1, wherein the signal layers include:
   a first group of signal layers corresponding to the first area; and
   a second group of signal layers that correspond to the second area and that are different from the first group of signal layers,
   wherein the multiple pairs of first differential signals are transferred through the first group of signal layers, and
   wherein the multiple pairs of second differential signals are transferred through the second group of signal layers.

3. The apparatus of claim 2, wherein the second area is closer to the integrated circuit package compared to the first area, and
   wherein the second group of signal layers are at a different height of the multilayer lamination compared to the first group of signal layers.

4. The apparatus of claim 1, wherein the multiple pairs of first differential signals are signals transferred from the printed circuit board to the integrated circuit package, and wherein the multiple pairs of second differential signals are signals transferred from the integrated circuit package to the printed circuit board.

5. The apparatus of claim 1, wherein strengths of the multiple pairs of first differential signals are weaker than strengths of the multiple pairs of second differential signals.

6. The apparatus of claim 1, wherein the plurality of vias include:
   first vias that are coupled to the first bonding pads or the second bonding pads and that are back-drilled vias.

7. The apparatus of claim 1, wherein the plurality of vias include:
   second vias that are coupled to the third bonding pads and that are conductive vias.

8. The apparatus of claim 1, further comprising:
   a substrate;
   an integrated circuit chip arranged on the substrate; and
   a ball grid array configured to electrically and mechanically couple the substrate to the printed circuit board, the ball grid array including:
      first solder balls that are arranged in a first section of the ball grid array and that are configured to transfer the multiple pairs of first differential signals between the substrate and the printed circuit board, each of the first solder balls being coupled to a via of the plurality of vias,
      second solder balls that are arranged in a second section of the ball grid array and that are configured to transfer the multiple pairs of second differential signals between the substrate and the printed circuit board, each of the second solder balls being coupled to a via of the plurality of vias, and
      third solder balls that are arranged in a third section of the ball grid array and that couples the substrate to ground of the printed circuit board, each of the third solder balls being coupled to two or more vias of the plurality of vias.

9. The apparatus of claim 8, wherein the first section, the second section, and the third section are outside a perimeter of the integrated circuit chip.

10. The apparatus of claim 8, wherein the first section corresponds to the first area of the printed circuit board, the second section corresponds to the second area of the printed circuit board, and the third section corresponds to the third area of the printed circuit board.

11. The apparatus of claim 1, wherein the multiple pairs of first differential signals have an amplitude between 50 mV and 5 V.

12. The apparatus of claim 1, wherein the multiple pairs of second differential signals have an amplitude between 50 mV and 5 V.

13. The apparatus of claim 1, wherein the multiple pairs of first differential signals are transferred at a sampling rate between 1 Gb/s and 500 Gb/s.

14. The apparatus of claim 1, wherein the multiple pairs of second differential signals are transferred at a sampling rate between 1 Gb/s and 500 Gb/s.

15. The apparatus of claim 1, wherein a first amplitude for the multiple pairs of first differential signals are different from a second amplitude for the multiple pairs of second differential signals.

16. The apparatus of claim 1, wherein a first sampling rate for the multiple pairs of first differential signals are different from a second sampling rate for the multiple pairs of second differential signals.

17. The apparatus of claim 1, further comprising:
a first dog bone pattern that includes a third bonding pad of the third bonding pads and a via of the two or more vias of the plurality of vias in the third area, and
a second dog bone pattern that includes a first bonding pad of the first bonding pads and a via of the plurality of vias in the first area,
wherein the first dog bone pattern is oriented 180 degrees relative to the second dog bone pattern.

18. The apparatus of claim 1, further comprising:
a first dog bone pattern that includes a third bonding pad of the third bonding pads and a via of the two or more vias of the plurality of vias in the third area, and
a second dog bone pattern that includes a second bonding pad of the second bonding pads and a via of the plurality of vias in the second area,
wherein the first dog bone pattern is oriented 270 degrees relative to the second dog bone pattern.

19. An integrated circuit package comprising:
a substrate;
an integrated circuit chip arranged on the substrate; and
a ball grid array configured to electrically and mechanically couple the substrate to a printed circuit board, the ball grid array including:
first solder balls that are arranged in a first section of the ball grid array and that are configured to transfer multiple pairs of first differential signals between the substrate and the printed circuit board, each of the first solder balls configured to be coupled to a first via of the printed circuit board through a first bonding pad of the printed circuit board,
second solder balls that are arranged in a second section of the ball grid array and that are configured to transfer multiple pairs of second differential signals between the substrate and the printed circuit board, each of the second solder balls configured to be coupled to a second via of the printed circuit board through a second bonding pad of the printed circuit board, and
third solder balls that are arranged in a third section of the ball grid array and that couples the substrate to ground of the printed circuit board, each of the third solder balls configured to be coupled to two or more third vias of the printed circuit board through a third bonding pad of the printed circuit board,
wherein the third section is located between the first section and the second section.

20. The integrated circuit package of claim 19, wherein the multiple pairs of first differential signals are signals transferred from the printed circuit board to the integrated circuit package, and
wherein the multiple pairs of second differential signals are signals transferred from the integrated circuit package to the printed circuit board.

21. The integrated circuit package of claim 19, wherein strengths of the multiple pairs of first differential signals are weaker than strengths of the multiple pairs of second differential signals.

22. The integrated circuit package of claim 19, wherein the first section, the second section, and the third section are outside a perimeter of the integrated circuit chip.

23. The integrated circuit package of claim 20, wherein the second section is closer to the integrated circuit chip compared to the first section.

24. The integrated circuit package of claim 19, wherein the multiple pairs of first differential signals have an amplitude between 50 mV and 5 V.

25. The integrated circuit package of claim 19, wherein the multiple pairs of second differential signals have an amplitude between 50 mV and 5 V.

26. The integrated circuit package of claim 19, wherein the multiple pairs of first differential signals are transferred at a sampling rate between 1 Gb/s and 500 Gb/s.

27. The integrated circuit package of claim 19, wherein the multiple pairs of second differential signals are transferred at a sampling rate between 1 Gb/s and 500 Gb/s.

28. The integrated circuit package of claim 19, wherein a first amplitude for the multiple pairs of first differential signals are different from a second amplitude for the multiple pairs of second differential signals.

29. The integrated circuit package of claim 19, wherein a first sampling rate for the multiple pairs of first differential signals are different from a second sampling rate for the multiple pairs of second differential signals.

30. The integrated circuit package of claim 19, wherein each of the first solder balls is coupled to a first dog bone pattern that includes a first bonding pad of the first bonding pads and a first via of the first vias,
wherein each of the third solder balls is coupled to a second dog bone pattern that includes a third bonding pad of the third bonding pads and a third via of the two or more third vias of the third vias, and
wherein the first dog bone pattern is oriented 180 degrees relative to the second dog bone pattern.

31. The integrated circuit package of claim 19, wherein each of the second solder balls is coupled to a first dog bone pattern that includes a second bonding pad of the second bonding pads and a second via of the second vias,
wherein each of the third solder balls is coupled to a second dog bone pattern that includes a third bonding pad of the third bonding pads and a third via of the two or more third vias of the third vias, and
wherein the first dog bone pattern is oriented 270 degrees relative to the second dog bone pattern.

32. A network device comprising:
a printed circuit board that includes:
a multilayer lamination of one or more ground layers, one or more power layers, and a plurality of signal layers,
a plurality of vias that are located on a first surface of the printed circuit board, and
a plurality of bonding pads that couple a ball grid array of an integrated circuit package to the one or more ground layers, the one or more power layers, and the plurality of signal layers through the plurality of vias, wherein the plurality of bonding pads includes:
first bonding pads that are arranged in a first area of the printed circuit board and that are configured to transfer multiple pairs of first differential signals between the printed circuit board and the integrated circuit package, each of the first bonding pads being coupled to a via of the plurality of vias in the first area,
second bonding pads that are arranged in a second area of the printed circuit board and that are configured to transfer multiple pairs of second differential signals between the printed circuit board and the integrated circuit package, each of the second bonding pads being coupled to a via of the plurality of vias in the second area, and
third bonding pads that are arranged in a third area of the printed circuit board and that couple the integrated circuit package to ground of the printed circuit board, each of the third bonding pads being coupled to two or more vias of the plurality of vias in the third area, wherein the third area is located between the first area and the second area;

a substrate;

an integrated circuit chip arranged on the substrate and that is configured to transmit or receive the multiple pairs of first differential signals and the multiple pairs of second differential signals; and a ball grid array configured to electrically and mechanically couple the substrate to the printed circuit board, the ball grid array including:

first solder balls that are arranged in a first section of the ball grid array and that are configured to transfer the multiple pairs of first differential signals between the substrate and the printed circuit board, each of the first solder balls being coupled to a via of the plurality of vias, second solder balls that are arranged in a second section of the ball grid array and that are configured to transfer the multiple pairs of second differential signals between the substrate and the printed circuit board, each of the second solder balls being coupled to a via of the plurality of vias, and third solder balls that are arranged in a third section of the ball grid array and that couples the substrate to ground of the printed circuit board, each of the third solder balls being coupled to two or more vias of the plurality of vias.

33. The network device of claim 32, wherein the network device is a router.

34. The network device of claim 32, wherein the network device is a network switch.

* * * * *